(12) United States Patent
Miyatake et al.

(10) Patent No.: US 9,176,354 B2
(45) Date of Patent: Nov. 3, 2015

(54) LIQUID CRYSTAL DISPLAY DEVICE

(75) Inventors: Masaki Miyatake, Saitama-ken (JP);
Tetsuya Iizuka, Saitama-ken (JP);
Katsuhiro Hoshina, Saitama-ken (JP)

(73) Assignee: JAPAN DISPLAY INC., Tokyo (JP)

( * ) Notice: Subject to any disclaimer, the term of this patent is extended or adjusted under 35 U.S.C. 154(b) by 397 days.

(21) Appl. No.: 13/241,730

(22) Filed: Sep. 23, 2011

(65) Prior Publication Data

US 2012/0119982 A1    May 17, 2012

(30) Foreign Application Priority Data

Nov. 16, 2010    (JP) ................................. 2010-256109

(51) Int. Cl.
*G02F 1/1368* (2006.01)
*G02F 1/1362* (2006.01)
*G11C 19/28* (2006.01)
*G09G 3/36* (2006.01)

(52) U.S. Cl.
CPC ........ *G02F 1/1368* (2013.01); *G02F 1/136227* (2013.01); *G09G 3/3648* (2013.01); *G09G 3/3677* (2013.01); *G11C 19/282* (2013.01); *G02F 1/136286* (2013.01); *G09G 2310/0281* (2013.01)

(58) Field of Classification Search
CPC ............ G02F 1/1368; G02F 1/136227; G11C 19/282
USPC ........................................................ 257/240
See application file for complete search history.

(56) References Cited

U.S. PATENT DOCUMENTS 5,784,135 A * 7/1998 Inada et al. ...................... 349/85
6,556,265 B1 * 4/2003 Murade .......................... 349/111
6,617,796 B2    9/2003 Sasaki et al.
(Continued)

FOREIGN PATENT DOCUMENTS

JP    09-258261    * 10/1997    .............. G02F 1/136
JP    9-258261 A    10/1997
(Continued)

OTHER PUBLICATIONS

Office Action issued Feb. 12, 2013, in Japanese Patent Application No. 2010-256109 (submitting English translation only).
(Continued)

*Primary Examiner* — Lauren Nguyen
*Assistant Examiner* — Anthony G Quash
(74) *Attorney, Agent, or Firm* — Oblon, McClelland, Maier & Neustadt, L.L.P.

(57) ABSTRACT

In one aspect, a liquid crystal display device includes a display region formed of plural divided regions in a row direction. First and second driving circuits are arranged to face each other interposing the display region therebetween in the row direction. The first driving circuit is connected with odd scanning lines, and the second driving circuit is connected with the even scanning lines. A channel area of the TFT of the pixels connected to the odd scanning lines is the smallest in the divided region nearest to the first driving circuit and becomes larger gradually in the divided regions distant from the first driving circuit. A channel area of the TFT of the pixels connected to the even scanning lines is the smallest in the divided region nearest to the second driving circuit and becomes larger gradually in the divided regions with distant from the second driving circuit.

8 Claims, 6 Drawing Sheets

| | CHANNEL LENGTH [μm] | | | | | | | | | | | |
|---|---|---|---|---|---|---|---|---|---|---|---|---|
| | DIVIDED REGION R1 | | | | | | DIVIDED REGION R2 | | | | | |
| | S355 | S356 | S357 | S358 | S359 | S360 | S361 | S362 | S363 | S364 | S365 | S366 |
| G1 | 3 | 3 | 3.5 | 3 | 3.5 | 3 | 3.5 | 3 | 3.5 | 3 | 3.5 | 3.5 |
| G2 | 4.5 | 4.5 | 4 | 4.5 | 4 | 4.5 | 4 | 4.5 | 4 | 4.5 | 4 | 4 |
| G3 | 3 | 3 | 3.5 | 3 | 3.5 | 3 | 3.5 | 3 | 3.5 | 3 | 3.5 | 3.5 |
| G4 | 4.5 | 4.5 | 4 | 4.5 | 4 | 4.5 | 4 | 4.5 | 4 | 4.5 | 4 | 4 |
| G5 | 3 | 3 | 3.5 | 3 | 3.5 | 3 | 3.5 | 3 | 3.5 | 3 | 3.5 | 3.5 |
| G6 | 4.5 | 4.5 | 4 | 4.5 | 4 | 4.5 | 4 | 4.5 | 4 | 4.5 | 4 | 4 |
| G7 | 3 | 3 | 3.5 | 3 | 3.5 | 3 | 3.5 | 3 | 3.5 | 3 | 3.5 | 3.5 |
| G8 | 4.5 | 4.5 | 4 | 4.5 | 4 | 4.5 | 4 | 4.5 | 4 | 4.5 | 4 | 4 |
| G9 | 3 | 3 | 3.5 | 3 | 3.5 | 3 | 3.5 | 3 | 3.5 | 3 | 3.5 | 3.5 |
| G10 | 4.5 | 4.5 | 4 | 4.5 | 4 | 4.5 | 4 | 4.5 | 4 | 4.5 | 4 | 4 |
| G799 | 3 | 3 | 3.5 | 3 | 3.5 | 3 | 3.5 | 3 | 3.5 | 3 | 3.5 | 3.5 |
| G800 | 4.5 | 4.5 | 4 | 4.5 | 4 | 4.5 | 4 | 4.5 | 4 | 4.5 | 4 | 4 |

BOUNDARY REGION RB
(GRADATION REGION)

(56) References Cited

U.S. PATENT DOCUMENTS

| | | |
|---|---|---|
| 6,683,593 B2 | 1/2004 | Miyatake et al. |
| 6,756,960 B2 | 6/2004 | Miyatake |
| 7,508,371 B2 | 3/2009 | Kitani et al. |
| 7,894,007 B2 | 2/2011 | Fukami et al. |
| 2008/0170005 A1* | 7/2008 | Osame et al. .................. 345/76 |
| 2013/0214280 A1* | 8/2013 | Sato .............................. 257/59 |

FOREIGN PATENT DOCUMENTS

| | | | | |
|---|---|---|---|---|
| JP | 2002-098990 | * | 4/2002 | ............ G02F 1/1368 |
| JP | 2008-304659 | | 12/2008 | |
| JP | 2009-175212 | * | 8/2009 | ............... G09G 3/36 |
| JP | 2009-175212 A | | 8/2009 | |
| KR | 10-2005-0015033 | * | 2/2005 | ............. G02F 1/136 |
| KR | 10-2008-0070355 | * | 7/2008 | ............. G02F 1/136 |

OTHER PUBLICATIONS

U.S. Appl. No. 13/668,722, filed Nov. 5, 2012, Miyatake.

* cited by examiner

CHANNEL
AREA

FIG. 8

| | | CHANNEL WIDTH [μm] | CHANNEL LENGTH [μm] | LDD LENGTH [μm] | |
|---|---|---|---|---|---|
| DIVIDED REGION R1 | ODD ROW LINE | 3.0 | 3.0 | 5.0 | S353 (G1) |
| | EVEN ROW LINE | 3.0 | 4.5 | 5.0 | S356 (G2) |
| DIVIDED REGION R2 | ODD ROW LINE | 3.0 | 3.5 | 5.0 | S365 (G1) |
| | EVEN ROW LINE | 3.0 | 4.0 | 5.0 | S366 (G2) |
| DIVIDED REGION R3 | ODD ROW LINE | 3.0 | 4.0 | 5.0 | |
| | EVEN ROW LINE | 3.0 | 3.5 | 5.0 | |
| DIVIDED REGION R4 | ODD ROW LINE | 3.0 | 4.5 | 5.0 | |
| | EVEN ROW LINE | 3.0 | 3.0 | 5.0 | |

FIG. 7

GRADUAL CHANGE

FIG. 8

| | S355 | S356 | S357 | S358 | S359 | S360 | S361 | S362 | S363 | S364 | S365 | S366 |
|---|---|---|---|---|---|---|---|---|---|---|---|---|
| | DIVIDED REGION R1 | | BOUNDARY REGION RB (GRADATION REGION) | | | | | | | | DIVIDED REGION R2 | |
| | | | CHANNEL LENGTH [μm] | | | | | | | | | |
| G1 | 3 | 3 | 3.5 | 3 | 3.5 | 3 | 3.5 | 3 | 3.5 | 3 | 3.5 | 3.5 |
| G2 | 4.5 | 4.5 | 4 | 4.5 | 4 | 4.5 | 4 | 4.5 | 4 | 4.5 | 4 | 4 |
| G3 | 3 | 3 | 3.5 | 3 | 3.5 | 3 | 3.5 | 3 | 3.5 | 3 | 3.5 | 3.5 |
| G4 | 4.5 | 4.5 | 4 | 4.5 | 4 | 4.5 | 4 | 4.5 | 4 | 4.5 | 4 | 4 |
| G5 | 3 | 3 | 3.5 | 3 | 3.5 | 3 | 3.5 | 3 | 3.5 | 3 | 3.5 | 3.5 |
| G6 | 4.5 | 4.5 | 4 | 4.5 | 4 | 4.5 | 4 | 4.5 | 4 | 4.5 | 4 | 4 |
| G7 | 3 | 3 | 3.5 | 3 | 3.5 | 3 | 3.5 | 3 | 3.5 | 3 | 3.5 | 3.5 |
| G8 | 4.5 | 4.5 | 4 | 4.5 | 4 | 4.5 | 4 | 4.5 | 4 | 4.5 | 4 | 4 |
| G9 | 3 | 3 | 3.5 | 3 | 3.5 | 3 | 3.5 | 3 | 3.5 | 3 | 3.5 | 3.5 |
| G10 | 4.5 | 4.5 | 4 | 4.5 | 4 | 4.5 | 4 | 4.5 | 4 | 4.5 | 4 | 4 |
| G799 | 3 | 3 | 3.5 | 3 | 3.5 | 3 | 3.5 | 3 | 3.5 | 3 | 3.5 | 3.5 |
| G800 | 4.5 | 4.5 | 4 | 4.5 | 4 | 4.5 | 4 | 4.5 | 4 | 4.5 | 4 | 4 |

LIQUID CRYSTAL DISPLAY DEVICE

CROSS-REFERENCE TO RELATED APPLICATION

This application is based upon and claims the benefit of priority from Japanese Patent Application No. P2010-256109, filed Nov. 16, 2010, the entire contents of which are incorporated herein by reference.

FIELD

Embodiments described herein relate generally to a liquid crystal display device.

BACKGROUND

Generally, the liquid crystal display device which has features of a light weight, a thin shape, and low power consumption is used as a display device. The liquid crystal display device is equipped with an array substrate, a counter substrate arranged opposing the array substrate with a gap therebetween, and a liquid crystal layer held between the array substrate and the counter substrate.

The array substrate includes a glass substrate. In a display region, a plurality of signal lines and a plurality of scanning lines cross on the glass substrate. A Thin Film Transistor (TFT) is arranged near an intersection portion where each of the signal lines crosses each of the scanning lines, and each TFT forms a pixel. Moreover, a driving circuit (Y driver) connected to the plurality of the scanning lines is arranged on the glass substrate.

By the way, in the liquid crystal display device, the demand for high definition and narrow frame is becoming strong. When advancing the features of the high definition and the narrow frame, a large width of the driving circuit results in a problem. The single-sided arrangement of the left-hand side or the right-hand side of the Y driver is common for the liquid crystal display device especially with a small panel size used for cellular phones, digital still cameras, etc.

Moreover, in the above-mentioned liquid crystal display device, the screen size becomes larger, and the number of pixels increases every year. Since the occupied area of the Y driver corresponding to each scanning line is decided beforehand, if the number of pixels increases and a pixel pitch becomes narrow, a layout width of the Y driver with respect to the pixel pitch is expanded relatively. However, when the layout width of the Y driver is expanded, there is a problem that the narrow frame technique can not be advanced.

Then, when the narrow frame technique is advanced, it is possible to arrange the Y driver on the glass substrate by dividing the above-mentioned Y driver on the both sides of the display region. For example, odd scan lines are connected to the left-hand side of the Y driver, and even scanning lines are connected to the right-hand side of the Y driver. Thereby, although the layout of the Y driver for one scanning stage was conventionally arranged at one pixel pitch, it becomes possible to arrange the layout of the Y driver for one scanning stage at two pixel pitches in the above technique. As a result, since the Y driver can take a sufficient layout area even if the width of the Y driver is set to be narrower, the narrow frame is achieved.

However, in the above-mentioned liquid crystal display device, especially in the liquid crystal display device with a large screen size or a high definition characteristics, when a gray raster display is carried out by a line inversion drive (horizontal line inversion drive system) which changes polarity for every line, a flicker on the right-and-left end of the screen is caused.

Here, the causes which generate the flicker are explained. In the scanning lines, one end to which the scanning signals are inputted is set to a starting end, and another end at which the transmitting of the scan signals terminates is set to a terminal end. The waveform is more rounded at the terminal end side compare with the starting end side due to a load of the scanning line. Since a punch-through voltage remarkably depends on the waveform of the scanning signal, the punch-through voltage becomes smaller by the enlargement of the roundness of the waveform at the terminal end side. As a result, the holding potential of the pixel becomes larger at the terminal end side.

At a left end and a right end of the screen, since the starting end and the terminal end of the scanning line are arranged by turns, the pixels with the large punch-through voltage and the pixels with the small punch-through voltage (high or low holding potential in the pixel) are also arranged by turns. Moreover, the holding voltage difference among the pixels due to the difference of the punch-through voltages depends on the polarity of the holding voltage.

For example, in case of a dot inversion drive (HV/horizontal-vertical inversion drive) in which the polarity is changed in each pixel, the pixels of positive polarity and negative polarity are arranged alternately for both of the odd row lines and even row lines for one frame. As a result, the influence by the punch-through voltage of the pixels is balanced for each row line.

On the other hand, in the line inversion drive, since the polarities of the pixels differ in the odd row lines and the even row lines, and further the punch-through voltage is different between the positive polarity pixel and the negative polarity, the influence by the punch-through voltage changes in every row line. When a gray raster display is performed by the line inversion drive, the fault that a flicker occurs at the right-and-left end of the display region arises due to above-mentioned causes.

BRIEF DESCRIPTION OF THE DRAWINGS

The accompanying drawings, which are incorporated in and constitute a portion of the specification, illustrate embodiments of the invention, and together with the general description given above and the detailed description of the embodiments given below, serve to explain the principles of the invention.

FIG. 7 is a table showing a channel width W, a channel length L, and an LDD length of the TFT in respective divided regions R1 to R4 in the liquid crystal display device according to the first embodiment.

FIG. 8 is a table showing the channel length L for each pixel of divided regions R1 and R2 including a boundary region RB of the respective divided regions of the liquid crystal display device according a second embodiment.

DETAILED DESCRIPTION OF THE INVENTION

Figure 1:
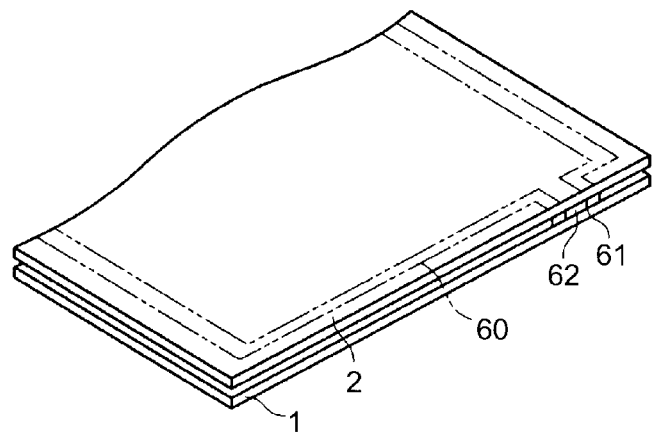
FIG. 1 is a perspective view schematically showing a liquid crystal display device according a first embodiment.

A liquid crystal display device according to an exemplary embodiment of the present invention will now be described with reference to the accompanying drawings wherein the same or like reference numerals designate the same or corresponding portions throughout the several views.

According to one embodiment, a liquid crystal display device includes: an array substrate having; signal lines extending in a column direction, scanning lines extending in a row direction and crossing the signal lines, a display region including a plurality of divided regions arranged in the row direction, a plurality of pixels formed in the display region in which the signal lines and the scanning lines cross, each pixel including a thin film transistor connected with the signal line and the scanning line, and a first driving circuit and a second driving circuit arranged so as to face each other interposing the display region therebetween in the row direction, wherein the first driving circuit is connected with the scanning lines arranged in odd row lines, and the second driving circuit being connected with the scanning lines arranged in even row lines, a counter substrate arranged opposing the array substrate with a gap therebetween; a liquid crystal layer held between the array substrate and the counter substrate; wherein a channel area of the thin film transistor of the pixels connected to the scanning lines arranged in the odd lines is the smallest in the divided region nearest to the first driving circuit and becomes larger gradually in the divided regions distant from the first driving circuit to the second driver circuit, and a channel area of the thin film transistor of the pixels connected to the scanning lines arranged in the even lines is the smallest in the divided region nearest to the second driving circuit and becomes larger gradually in the divided regions distant from the second driving circuit to the first driver circuit.

Figure 6:
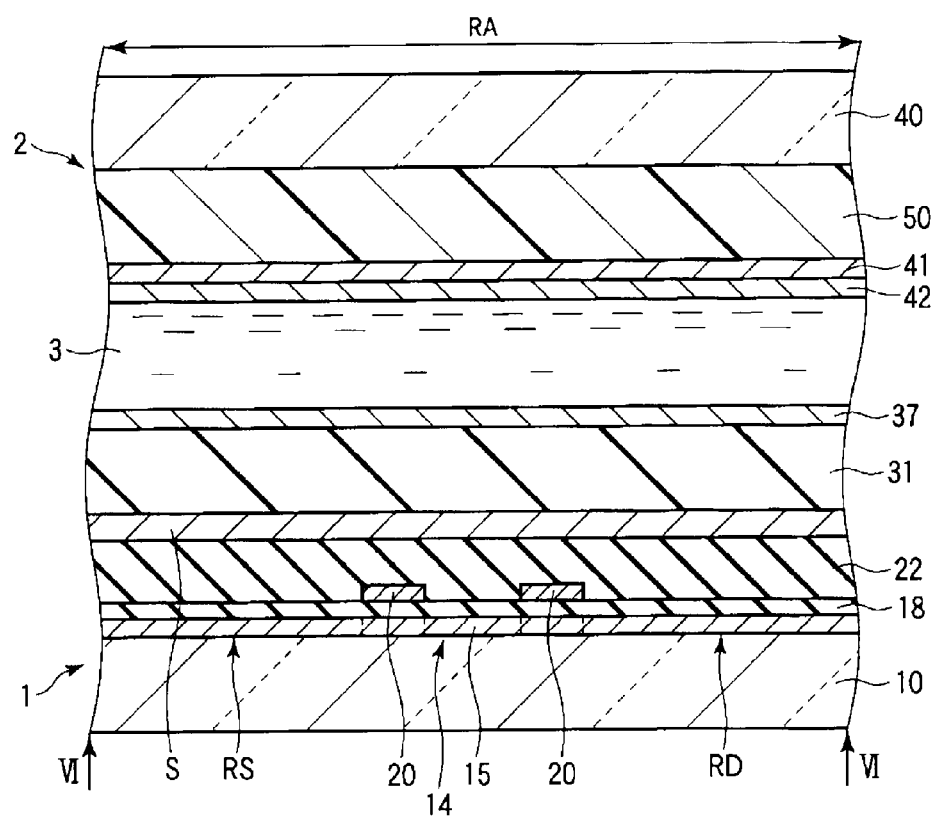
FIG. 6 is a cross-sectional view of the liquid crystal display device taken along line VI-VI in FIG. 5.

Hereafter, the liquid crystal display according to the first embodiment is explained referring to the drawings. As shown in FIG. 1 and FIG. 6, the liquid crystal display device includes an array substrate 1, a counter substrate 2 arranged opposing the array substrate 1, and a liquid crystal layer 3 held between the both substrates.

Figure 2:
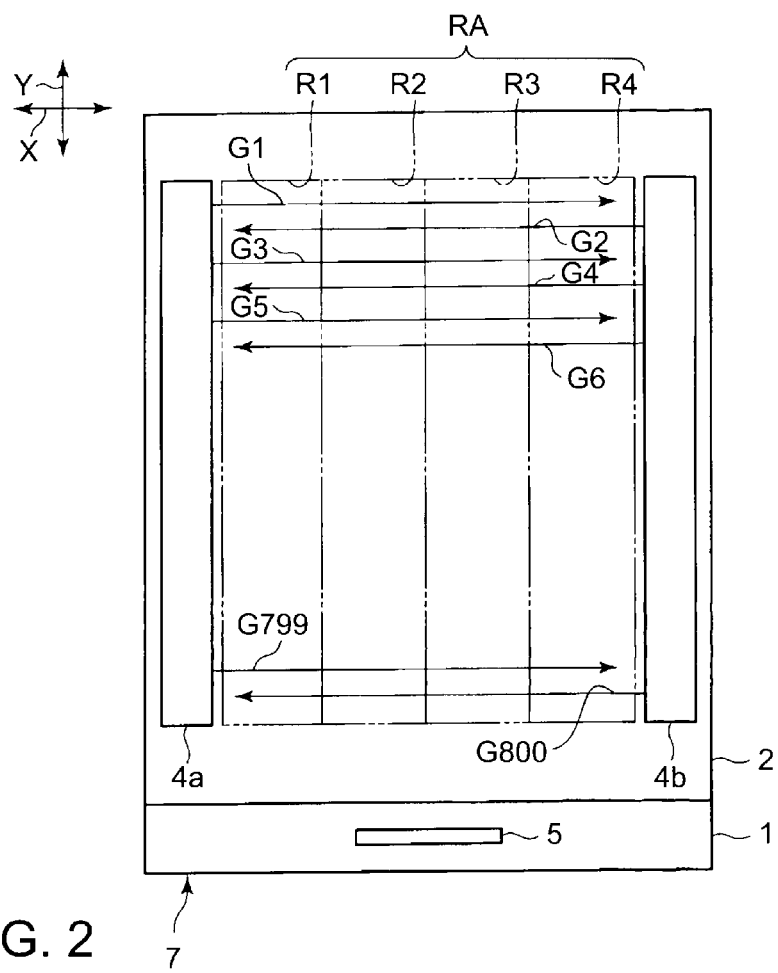
FIG. 2 is a plan view schematically showing a structure of the liquid crystal display shown in FIG. 2.
Figure 3:
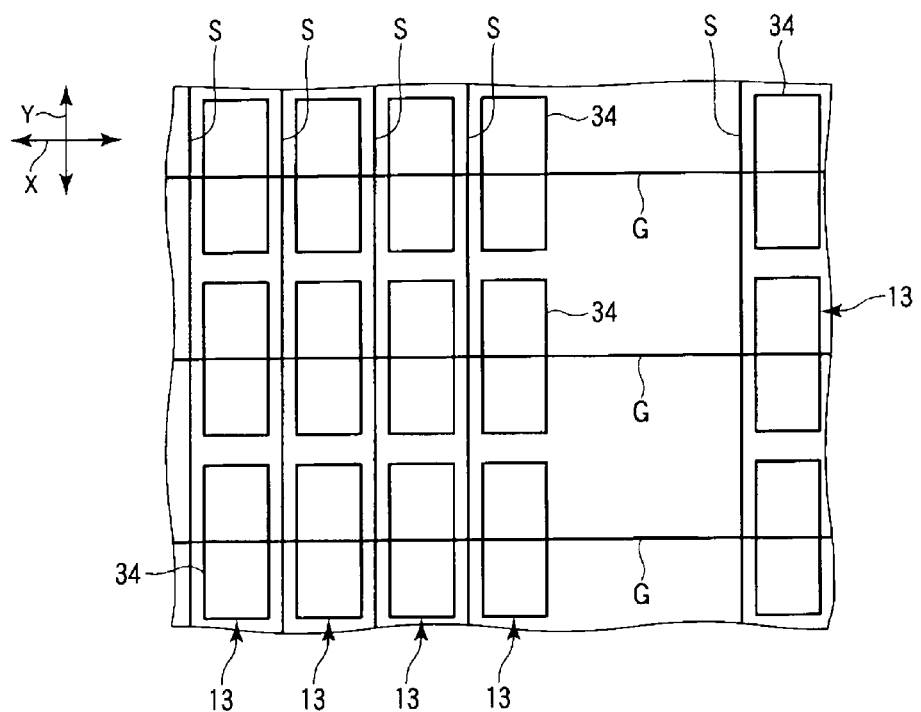
FIG. 3 is a plan view schematically showing a portion of an array substrate shown in FIG. 1 and FIG. 2.
Figure 4:
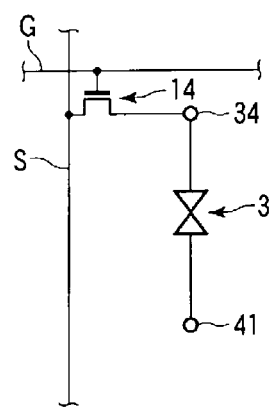
FIG. 4 is an equivalent circuit of a pixel in the liquid crystal display device according to the first embodiment.

As shown in FIG. 2, the liquid crystal display device includes a display region RA in which the array substrate 1 and the counter substrate 2 overlaps. The liquid crystal display device is equipped with a control portion 7. The control portion 7 includes a scanning line driving circuit 4a as a first driving circuit, and a scanning line driving circuit 4b as a second driving circuit and a signal line driving circuit 5.

On the glass substrate 10, the scanning line driving circuits 4a and 4b are formed, and the signal line driving circuit 5 is mounted on the outside of the display region RA. The scanning line driving circuits 4a and 4b are connected with a plurality of scanning lines G which extend to the outside of the display region RA. Similarly, the signal line driving circuit 5 is connected with a plurality of signal lines S which extend to the outside of the display region RA.

As shown in FIG. 1 to FIG. 6, the array substrate 1 includes a glass substrate 10 as a transparent insulating substrate, for example. The plurality of scanning lines G which extend in a row direction X and the plurality of signal lines S which extend in a column direction Y crossing perpendicularly with the row direction X are arranged on the glass substrate 10 in the display region RA. The plurality of scanning lines G and the plurality of signal lines S cross in the display region RA.

The array substrate 1 includes a plurality of pixels 13 arranged in the shape of a matrix in the display region RA.

Next, one pixel 13 is explained as a representative. The pixel 13 includes a pixel electrode 34 and a TFT 14 connected to the pixel electrode 34.

In detail, a semiconductor layer 15 is formed on the glass substrate 10. The semiconductor layer 15 extends in the column direction Y. The semiconductor layer 15 is formed by patterning a semiconductor film formed on the glass substrate 10. In this embodiment, the semiconductor layer 15 is formed with poly-silicon.

A gate insulating film 18 is formed on the glass substrate 10 and the semiconductor layer 15. The plurality of scanning lines G and a plurality of gate electrodes 20 which are respectively portions of the scanning lines G are formed on the gate insulating film 18. The gate electrode 20 is formed by branching a portion of the scanning line G into two portions.

The scanning line G and the gate electrode 20 are simultaneously formed of low resistance materials, such as aluminum and molybdenum-tungsten. In this embodiment, the scanning line G and the gate electrode 20 are formed with the molybdenum-tungsten. Each gate electrode 20 is formed so as to overlap with each semiconductor layer 15.

An interlayer insulating film 22 is formed on the gate insulating film 18, the scanning line G, and the gate electrode 20. On the interlayer insulating film 22, a plurality of signal line S, a plurality of source electrodes (not shown), and a plurality of drain electrodes (not shown) are formed.

The signal line S and the source electrode are integrally formed, and are electrically connected mutually. The signal line S counters the semiconductor layer 15. The source electrode is electrically connected with the source region RS of the semiconductor layer 15 through a contact hole (not shown) which penetrates respective portions of the gate insulation film 18 and the interlayer insulation films 22. The drain electrode is electrically connected with the drain region RD of the semiconductor layer 15 through a contact hole (not shown) which penetrates respective portions of the gate insulating film 18 and the interlayer insulating film 22.

The signal line S, the source electrode, and the drain electrode are simultaneously formed of low resistance materials, such as aluminum and molybdenum-tungsten. In this embodiment, the signal line S, the source electrode, and the drain electrode are formed with aluminum. The planarization film 31 is formed with transparent resin as an insulating film on the interlayer insulating film 22, the signal line S, and the drain electrode.

On the planarization film 31, the plurality of pixel electrodes 34 are formed of transparent electric conductive materials, such as ITO (Indium Tin Oxide). The pixel electrodes 34 are arranged in the shape of a matrix. The pixel electrode 34 is electrically connected with the drain electrode through a contact hole (not shown) formed in the planarization film 31. An alignment film 37 is formed on the pixel electrode 34.

As mentioned-above, the plurality of pillar-shaped spacers (not shown) are formed on the glass substrate 10 in which the TFT 14 and the pixel electrode 34 are formed. The alignment film 37 is formed on the glass substrate 10 in which the pillar-shaped spacers are formed. Each pixel 13 includes one TFT 14 and one pixel electrode 34.

Next, the counter substrate 2 is explained. As shown in FIG. 1, FIG. 2, FIG. 4, and FIG. 6, the counter substrate 2 includes a glass substrate 40 as a transparent insulating substrate, for example. A color filter 50 is formed on the glass substrate 40.

The color filter 50 includes a plurality of colored layers, such as red, green and blue colored layers. Each colored layer is formed in the shape of a stripe in parallel to the column direction Y in which the signal line S extends. The periphery of each colored layer overlaps with the signal line S. On the colored filter 50, a counter electrode 41 is formed of transparent electric conductive materials, such as ITO. An alignment film 42 is formed on the colored filter 50 and the counter electrode 41.

As shown in FIG. 1 and FIG. 6, the array substrate 1 and the counter substrate 2 are arranged opposing each other with a predetermined gap therebetween by the plurality of pillar-shaped spacers. The array substrate 1 and the counter substrate 2 are attached by a seal material 60 arranged between the substrates in the peripheral of the display region RA. The liquid crystal layer 3 is formed in the region surrounded by the array substrate 1, the counter substrate 2, and the seal material 60. A liquid crystal injecting mouth 61 is formed in a portion of the seal material 60, and the liquid crystal injecting mouth 61 is sealed with a sealing material 62.

Figure 5:
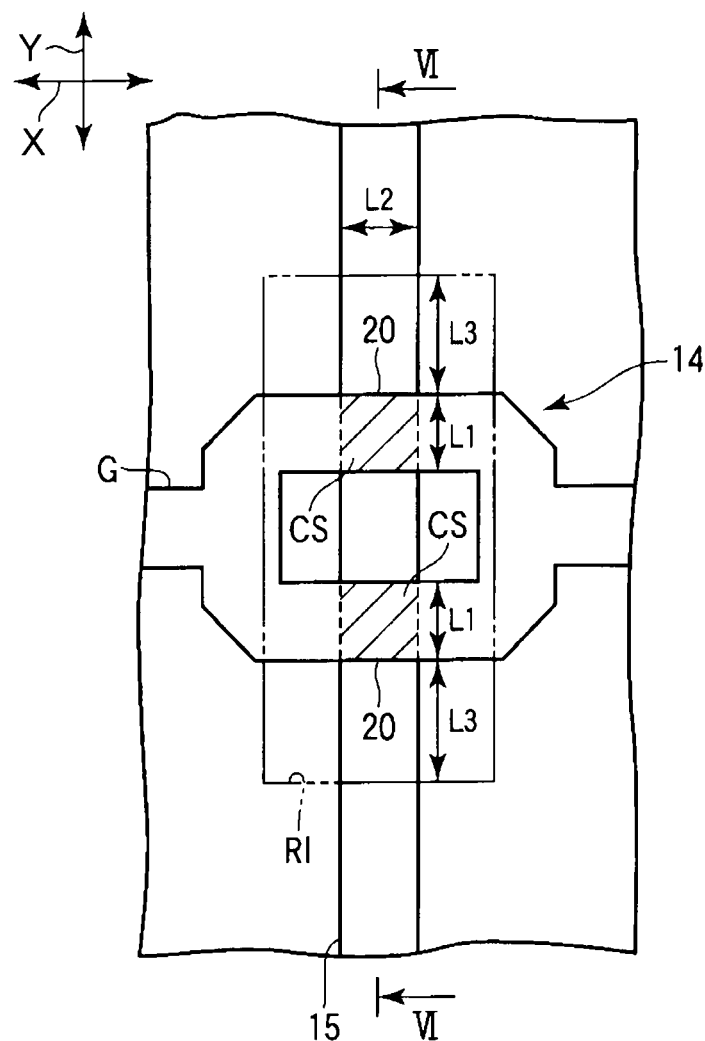
FIG. 5 is a figure showing a portion of a wiring structure of the array substrate, especially a TFT.

Next, the liquid crystal display device according to this embodiment is explained in detail. As shown in FIG. 5, the TFT14 adopts a double gate structure. In FIG. 5, RI is an impurity implanted region. L1 is a channel length. L2 is a channel width. L3 is a length of an LDD (Lightly Doped Drain) region. CS is a channel area.

As shown in FIG. 2, the liquid crystal display device is a WVGA type. The liquid crystal display device includes 800 scanning lines, i.e., a scanning line G1, a scanning line G2, and ..., a scanning G800. The scanning line driving circuits 4a and 4b are arranged at both ends so as to interpose the display region RA therebetween in the row direction X.

The scanning line driving circuit 4a is connected to a plurality of odd scanning lines G1, G3, ..., G799 so that scanning signals are supplied to the respective scanning lines G. The scanning line driving circuit 4b is connected with a plurality of even scanning lines G2, G4, and ..., G800, so that the scanning signals are supplied to the respective scanning lines.

The display region RA includes a plurality of divided regions R1, R2, R3, and R4 as a plurality of divided regions in the row direction X. The display region RA is divided into four regions in this embodiment. The different point among the divided regions R1, R2, R3, and R4 is the size of the TFT14. Here, the end to which the scanning signal is imputed is set to a starting end, and the end at which the transmitting of the scanning signals terminates is set to a terminal end.

In order to make the difference of the punch-through voltage small on the scanning line G, it is effective to enlarge more the channel area CS of the TFT14 on the terminal end side than the starting end side, and for the pixels on the terminal end side to enlarge more the punch-through voltage.

As mentioned-above, the channel area CS of the TFT14 of the plurality of pixels 13 connected to the plurality of odd scanning lines G1, G3, ..., G799, is the smallest in the divided region R1 nearest to the scanning line driving circuit 4a and becomes larger gradually with departing from the scanning line driving circuit 4a to divided regions R2, R3, and R4.

On the other hand, the channel area CS of the TFT14 of the plurality of pixels 13 connected to the plurality of even scanning lines G2, G4, ..., G800 is the smallest in the divided region R4 nearest to the scanning line driving circuit 4b and becomes larger gradually with departing from the scanning line driving circuit 4b to divided regions R3, R2, and R1.

FIG. 7 is a table showing the size of TFT14 in each of the divided regions R1 to R4. When the channel length L1 of the TFT14 of odd row lines is focused, the channel is 3.0 μm in the first divided region R1 (nearest to the starting end side), 3.5 μm in the second divided region R2, 4.0 μm in the third divided region R3, and 4.5 μm in the fourth divided region R4 (nearest to the terminal end side).

Similarly, when the channel length L1 of the TFT14 in the even row lines is focused, the channel is 3.0 μm in the fourth divided region R4 (nearest to the starting end side), 3.5 μm in the third divided region R3, 4.0 μm in the second divided region R2, and 4.5 μm in the first divided region R4 (nearest to the terminal end side).

The channel areas CS of the TFT14 of the plurality of pixels 13 are set up by adjusting the channel length L1. The sum of the channel areas CS of the TFT14 connected with each signal line is equal for all the signal lines S.

The LDD length L3 of the TFT14 of the plurality of pixels 13 connected to the odd scanning lines from G1, G3, ..., to G799 is the smallest in the divided region R1 nearest to the scanning line driving circuit 4a. Namely, when the TFT14 of the pixels 13 connected to the scanning line of odd row lines is focused, the LDD length L3 of the divided regions R2 to R4 does not become shorter than the LDD length L3 of the divided region R1, and in other words, the LDD length L3 of the divided region on the terminal end side does not become relatively shorter than the LDD length L3 of the divided region on the starting end side, relatively.

Similarly, the LDD length L3 of the TFT14 of the plurality of pixels 13 connected to the even scanning lines from G2, G4, ..., to G800 is the smallest in the divided region R4 nearest to the scanning line driving circuit 4b. Namely, when the TFT14 of the pixels 13 connected to the scanning line of even row lines is focused, the LDD length L3 of the divided regions R1 to R3 does not become shorter than the LDD length L3 of the divided region R4, and in other words, the LDD length L3 of the divided region on the terminal end side does not become relatively shorter than the LDD length L3 of the divided region on the starting end side.

In this embodiment, the LDD length L3 is the same in all the divided regions R1 to R4, and is 5.0 μm. In addition, the channel width L2 is also the same in all the divided regions R1 to R4, and is 3.0 μm.

In the liquid crystal display device according the first embodiment constituted as mentioned-above, the liquid crystal display device includes the array substrate 1, the counter substrate 2, and the liquid crystal layer 3. The array substrate includes the plurality of signal lines S, the plurality of scanning lines G, the plurality of pixels 13, the scanning line driving circuit 4a, and the scanning line driving circuit 4b formed on the glass substrate 10, respectively.

The channel area CS of the TFT14 of the plurality of pixels 13 connected to the odd row scanning lines G1, G3, ..., G799 is the smallest in the divided region R1 nearest to the scanning line driving circuit 4a and becomes larger gradually with departing from the scanning drive circuit 4a to the divided regions R2, R3 and R4. The channel area CS of the TFT14 of the plurality of pixels 13 connected to the even row scanning lines G2, G4, ..., G800 is the smallest in the divided region R4 nearest to the scanning line driving circuit 4b and becomes larger gradually with departing from the scanning line driving circuit 4b to the divided region R3 distant, R2, and R1.

Accordingly, the punch through voltage of the pixel 13 becomes the same from the starting end side to the terminal end side of the scanning line G, and the holding potential of the pixels 13 also becomes substantially the same. As a result, even if the gray raster display is performed using a line inversion drive, the flicker on the right-and-left end side of the display region RA can be reduced. For this reason, the liquid crystal display can obtain a natural display without the sense of discomfort.

Moreover, since the sum of channel areas CS of the pixels connected with each signal line is equal for all the signal lines, the generation of a line in the column direction Y can be reduced. As mentioned-above, a high quality liquid crystal display device is obtained in which the narrow frame can be attained, and the generation of the flicker can be suppressed.

Next, the liquid crystal display device according a second embodiment is explained. FIG. 8 is a table showing the channel length L1 of the pixel 13 of the divided regions R1 and R2, including the respective boundary regions of the adjacent divided regions R1 and R2. Excepting for the boundary regions, the channel length L1 of the TFT14 of the plurality of pixels 13 connected with the odd row scan lines G1, G3, . . . , G799 is 3.0 μm in the divided region R1, and 3.5 μm in the divided region R2.

Similarly, excepting for the boundary regions, the channel length L1 of the TFT14 of the plurality of the pixels 13 connected to the even row scan lines G2, G4, . . . , G800 is 4.5 μm in the divided region R1, and 4.0 μm in the divided region R2.

If the channel length L1 differs between the divided region R1 and the divided region R2, the punch-through voltage of the pixel 13 differs, and the holding potential of the pixel 13 also differs. Therefore, a line in the column direction Y (vertical line) may be generated in the boundary region between the divided region R1 and the divided region R2.

Then, in the boundary region RB (gradation region) of the adjacent divided regions, the pixel group of one divided region and the pixel group of another divided region are arranged by turns in the row direction X. If the boundary region RB between the divided region R1 and the divided region R2 is focused, the pixel of the divided region R1 and the pixel of the divided region R2 are arranged by turns in the row direction X.

For example, in case the channel length L1 of the divided region R1 is 3.0 μm, and the channel length of the divided region R2 is 3.5 μm, the pixel 13 whose channel length L1 is 3.0 μm and the pixel 13 whose L1 is 3.5 μm are arranged by turns in the boundary region RB in the row direction X.

That is, in the boundary region RB between the divided region R1 and the divided region R2, the pixels 13 of the divided region R1 and the divided region R2 are arranged so as to be mixed in the row direction X.

The above-mentioned arrangement is applied to all the boundary regions RB of not only the boundary region RB between the divided region R1 and the divided region R2 but all the adjacent divided regions. For this reason, in the boundary region RB between the adjacent divided regions, the pixels 13 of one divided region and another divided region are arranged so as to be mixed for every row lines in the row direction X.

In the liquid crystal display device according the second embodiment constituted as mentioned-above, the liquid crystal display device includes the array substrate 1, the counter substrate 2, and the liquid crystal layer 3. The array substrate 1 includes the plurality of signal lines S, the plurality of scanning lines G, the plurality of pixels 13, the scanning line driving circuit 4a, and the scanning line driving circuit 4b, respectively formed on the glass substrate 10.

The channel area CS of the TFT14 of the plurality of pixels 13 connected to the plurality of odd scanning lines G1, G3, . . . , G799 is the smallest in the divided region R1 nearest to the scanning line driving circuit 4a and becomes larger gradually as the divided regions are distant from the scanning line driving circuit 4a to the divided regions R2, R3, and R4. On the other hand, the channel area CS of the TFT14 of the plurality of pixels 13 connected to the plurality of even row scanning lines G2, G4, . . . , G800 is the smallest in the divided region R4 nearest to the scanning line driving circuit 4b and becomes larger gradually as the divided regions are distant from the scanning line driving circuit 4b to the divided regions R3, R2, and R1.

Thereby, the punch-through voltage of the pixels 13 becomes almost the same from the starting end side to the terminal end side of the scanning line G, and the holding voltage of the pixels 13 also becomes the same. As a result, even if the gray raster display is performed by the line inversion drive, a flicker by the right-and-left end side of the display region RA can be reduced. For this reason, the liquid crystal display device can obtain a natural display without the sense of incongruity.

In the boundary region RB of adjacent divided regions, for every row lines, the pixels 13 of one divided region and the pixels 13 of another divided region are arranged in a mix in the row direction X. Here, in the boundary region RB, the pixel of one divided region and the pixel of another divided region are arranged by turns in the row direction X.

Thereby, the holding potential difference of the pixel 13 caused by the punch-through voltage difference of the pixels 13 is generated in the boundary region RB with a certain width, not in a straight line shape. Accordingly, the generation of the vertical line can be reduced, that is, it is possible to make hard to be sighted as the vertical line.

Moreover, it is possible to reduce the generation of the line in the column direction Y by setting the sum of the channel areas CS of the TFT14 of the plurality of pixels 13 connected to each signal line equal for all the signal lines. As mentioned above, the narrow frame is achieved, and also the flicked is suppressed. As a consequence, a high quality liquid crystal display device is obtained.

In the above embodiments, for example, the channel area CS of the TFT14 of the pixels 13 can be set by adjusting the channel width L2 and the LDD length other than the channel length L1. Moreover, the channel area CS of the TFT14 of the pixels 13 can be set by simultaneously adjusting the channel length L1, channel width L2 and the LDD length.

Although the display region RA has the four divided regions R1, R2, R3, and R4 divided in the row direction X, the structure of the divided regions is not limited to this, and can be change variously. That is, it is necessary to provide a plurality of divided regions. Accordingly, the display region RA may be divided into two or three, or five or more.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A liquid crystal display device, comprising:
an array substrate including;
scanning lines extending in a row direction,
signal lines extending in a column direction perpendicularly crossing the row direction,
a display region including a plurality of divided regions arranged in the row direction, adjacent divided regions respectively including a boundary region adjacent each other, a plurality of pixels formed in the display region in which the signal lines and the scanning lines cross, each pixel including a thin film transistor (TFT) connected with the signal line and the scanning line, and a first driving circuit and a second driving circuit arranged so as to face each other interposing the display region therebetween in the row direction, the first driving circuit being connected with the scanning lines arranged in odd row lines, and the second driving circuit being connected with the scanning lines arranged in even row lines, a counter substrate arranged opposing the array substrate with a gap therebetween;

a liquid crystal layer held between the array substrate and the counter substrate; wherein a channel area of the TFT of the pixels connected to the scanning lines arranged in the odd row lines is the smallest in the divided region nearest to the first driving circuit and becomes larger gradually in the divided regions distant from the first driving circuit to the second driver circuit, and a channel area of the thin film transistor of the pixels connected to the scanning lines arranged in the even row lines is the smallest in the divided region nearest to the second driving circuit and becomes larger gradually in the divided regions distant from the second driving circuit to the first driver circuit, and a first divided region of one of first and second adjacent divided regions includes first TFTs having a first channel area and connected with one signal line in the first divided area, and the second divided region includes second TFTs having a second channel area and connected with a second line in the second divided area, and a boundary region including first TFTs from the first divided region and second TFTs from the second divided region at an area where the first and second divided regions are adjacent to each other, the first and second channel areas of the first TFTs and second TFTs are alternately arranged by every TFT in the row direction for each row in the boundary region.

2. The liquid crystal display device according to claim 1, wherein the channel area of the TFT of the pixels is set by adjusting a channel length of the TFT.

3. The liquid crystal display device according to claim 1, wherein the channel area of the TFT of the pixels is set by adjusting a channel width of the TFT.

4. The liquid crystal display device according to claim 1, wherein the channel area of the TFT of the pixels is set by adjusting the channel length and the channel width of the TFT.

5. The liquid crystal display device according to claim 1, wherein
an LDD length of the TFT of the pixels connected to the scanning lines arranged in the odd row lines is the smallest in the divided region nearest to the first driving circuit, and
an LDD length of the TFT of the pixels connected to the scanning lines arranged in the even row lines is the smallest in the divided region nearest to the second driving circuit.

6. The liquid crystal display device according to claim 1, wherein
the sum of the channel areas of the plurality of pixels connected with each signal line is equal for all the signal lines.

7. The liquid crystal display device according to claim 1, wherein the TFT is formed of a double gate type transistor.

8. The liquid crystal display device according to claim 1, wherein a line inversion is performed.

* * * * *